(12) United States Patent
Choi et al.

(10) Patent No.: US 11,651,813 B2
(45) Date of Patent: May 16, 2023

(54) CLOCK CORRECTION CIRCUIT AND MEMORY SYSTEM COMPRISING THE CLOCK CORRECTION CIRCUIT

(71) Applicant: SAMSUNG ELECTRONICS CO., LTD., Suwon-si (KR)

(72) Inventors: Hun-Dae Choi, Hwaseong-si (KR); Ga Ram Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 17/380,206

(22) Filed: Jul. 20, 2021

(65) Prior Publication Data

US 2022/0165322 A1 May 26, 2022

(30) Foreign Application Priority Data

Nov. 24, 2020 (KR) .......................... 10-2020-0158627

(51) Int. Cl.
*G11C 11/4076* (2006.01)
*H03K 5/156* (2006.01)
(Continued)

(52) U.S. Cl.
CPC ............ *G11C 11/4076* (2013.01); *G11C 7/22* (2013.01); *G11C 11/4091* (2013.01); *G11C 11/4093* (2013.01); *G11C 11/4096* (2013.01)

(58) Field of Classification Search
CPC ....... G11C 7/222; G11C 7/22; G11C 11/4076; G11C 7/1051; G11C 7/1066; G11C 7/106;
(Continued)

(56) References Cited

U.S. PATENT DOCUMENTS 6,897,692 B1 5/2005 Hughes
7,227,809 B2 6/2007 Kwak
(Continued)

FOREIGN PATENT DOCUMENTS

KR 100954108 4/2010
KR 101030275 4/2011

*Primary Examiner* — Ly D Pham
(74) *Attorney, Agent, or Firm* — F. Chau & Associates, LLC

(57) ABSTRACT

A clock correction circuit in which a correction accuracy of a duty cycle is increased is provided. The clock correction circuit comprises a delay-locked loop circuit configured to receive a first clock signal and generate a second clock signal obtained by delaying the first clock signal; a first duty cycle correction circuit configured to receive the second clock signal and generate a first correction clock signal obtained by correcting a duty cycle of the second clock signal; and a duty cycle detection circuit which includes a second duty cycle correction circuit and an error code generation circuit, wherein the error code generation circuit receives the first correction clock signal, and generates a first error code as to whether to correct the duty cycle of the second clock signal on the basis of the first correction clock signal, the second duty cycle correction circuit generates a second correction clock signal obtained by correcting the duty cycle of the first correction clock signal in response to the first error code, the error code generation circuit generates a second error code as to whether to correct the duty cycle of the second clock signal on the basis of the second correction clock signal, and the first duty cycle correction circuit receives the second error code, and generates a third correction clock signal obtained by correcting the duty cycle of the second clock signal in response to the second error code.

20 Claims, 15 Drawing Sheets

(51) Int. Cl.
*H03K 7/08* (2006.01)
*H03L 7/085* (2006.01)
*H03L 7/06* (2006.01)
*G11C 7/22* (2006.01)
*G11C 11/4093* (2006.01)
*G11C 11/4091* (2006.01)
*G11C 11/4096* (2006.01)

(58) Field of Classification Search
CPC . G11C 11/4096; G11C 16/4083; G11C 16/26; G11C 16/32; G11C 7/1072; G11C 11/4091; G11C 11/4093; G11C 29/02; G11C 29/026; G11C 29/028; G11C 29/50012; G11C 7/1078; G11C 7/1093; G11C 7/1048
USPC .................................................... 365/233.1
See application file for complete search history.

(56) References Cited

U.S. PATENT DOCUMENTS

| | | |
|---|---|---|
| 7,705,649 B1 | 4/2010 | Yu et al. |
| 8,106,694 B2 | 1/2012 | Kim |
| 8,324,946 B2 | 12/2012 | Becker et al. |
| 8,917,127 B2 | 12/2014 | Kitagawa |
| 8,947,143 B2 | 2/2015 | Ma |
| 8,976,620 B2 | 3/2015 | Huang |
| 9,018,994 B2 | 4/2015 | Kang et al. |
| 9,059,691 B2 | 6/2015 | Lin |
| 9,071,237 B2 | 6/2015 | Lee et al. |
| 9,086,707 B2 | 7/2015 | Zhao |
| 9,124,257 B2 | 9/2015 | Desai et al. |
| 9,300,304 B2 | 3/2016 | Berkram et al. |
| 9,484,894 B2 | 11/2016 | Yasuda |
| 9,954,517 B2 | 4/2018 | Ma |
| 10,923,177 B1* | 2/2021 | Chang ................. G11C 11/4076 |
| 2004/0062121 A1* | 4/2004 | Chung ..................... G11C 7/22 |
| | | 365/222 |
| 2007/0075753 A1 | 4/2007 | Parker et al. |
| 2007/0152723 A1* | 7/2007 | Ahn ....................... H03L 7/0802 |
| | | 327/158 |
| 2012/0269014 A1* | 10/2012 | Kim ....................... H03L 7/0816 |
| | | 327/158 |
| 2016/0156342 A1* | 6/2016 | Yun ......................... H03L 7/085 |
| | | 327/158 |
| 2020/0412352 A1* | 12/2020 | Marko ................... G11C 16/32 |
| 2021/0335403 A1* | 10/2021 | Choi ....................... G11C 7/1057 |
| 2022/0052678 A1* | 2/2022 | Choi ....................... H03L 7/0816 |

* cited by examiner

CLOCK CORRECTION CIRCUIT AND MEMORY SYSTEM COMPRISING THE CLOCK CORRECTION CIRCUIT

CROSS-REFERENCE

This application claims priority under 35 USC § 119 to Korean Patent Application No. 10-2020-0158627 filed on Nov. 24, 2020 in the Korean Intellectual Property Office, the disclosure of which is incorporated by reference herein in its entirety.

FIELD

The present disclosure relates generally to semiconductor devices, and more particularly to a clock correction circuit and a memory system including a clock correction circuit.

DISCUSSION OF RELATED ART

General semiconductor devices may transmit data or receive data in synchronization with a clock signal. The clock signal provided to the semiconductor device may be distorted by internal elements of the semiconductor device. For example, the clock signal provided to the semiconductor device may be delayed or a duty cycle of the clock signal may be altered.

A delay-locked loop circuit that compensates for the delay time of the clock signal, and a duty cycle correction circuit that compensates for the duty cycle of the clock signal, are used in a synchronous semiconductor memory including a Double Data Rate Synchronous Dynamic Random-Access Memory (DDR SDRAM).

SUMMARY

Embodiments of the present disclosure may provide a clock correction circuit in which a correction accuracy of a duty cycle is increased.

Embodiments of the present disclosure may provide a memory system in which a correction accuracy of a duty cycle is increased.

However, embodiments of the present disclosure are not restricted to those set forth herein. The above and other embodiments of the present disclosure will become more apparent to those of ordinary skill in the art to which the present disclosure pertains by referencing the detailed description of the present disclosure as set forth below.

According to an embodiment of the present disclosure, the clock correction circuit comprises a delay-locked loop circuit configured to receive a first clock signal and generate a second clock signal obtained by delaying the first clock signal; a first duty cycle correction circuit configured to receive the second clock signal and generate a first correction clock signal obtained by correcting a duty cycle of the second clock signal; and a duty cycle detection circuit which includes a second duty cycle correction circuit and an error code generation circuit, wherein the error code generation circuit receives the first correction clock signal, and generates a first error code as to whether to correct the duty cycle of the second clock signal on the basis of the first correction clock signal, the second duty cycle correction circuit generates a second correction clock signal obtained by correcting the duty cycle of the first correction clock signal in response to the first error code, the error code generation circuit generates a second error code as to whether to correct the duty cycle of the second clock signal on the basis of the second correction clock signal, and the first duty cycle correction circuit receives the second error code, and generates a third correction clock signal obtained by correcting the duty cycle of the second clock signal in response to the second error code.

According to the aforementioned and other embodiments of the present disclosure, the clock correction circuit comprises a delay-locked loop circuit configured to receive a first clock signal, and generate a second clock signal obtained by delaying the first clock signal; a duty cycle correction circuit configured to receive the second clock signal, and generate a correction clock signal obtained by correcting a duty cycle of the second clock signal, the correction clock signal having a first frequency; a clock generator configured to receive the correction clock signal, and generate an update clock signal having a second frequency in response to the correction clock signal; and a duty cycle determination circuit configured to generate an error code, on the basis of the correction clock signal and the update clock signal, wherein the second frequency is different from the first frequency, and the duty cycle correction circuit receives the error code, and generates the correction clock signal obtained by correcting the duty cycle of the second clock signal in response to the error code during operation of the delay-locked loop circuit.

According to the aforementioned and other embodiments of the present disclosure, the memory system comprises a memory controller; and a memory device which is connected to the memory controller and receives a first clock signal from the memory controller, wherein the memory device includes a clock correction circuit, a memory cell array, and a data I/O buffer, the clock correction circuit generates an output clock signal on the basis of the first clock signal, the memory cell array includes a plurality of memory cells, the data I/O buffer stores the data which is read from the memory cell array, and outputs the data in synchronization with the output clock signal, the clock correction circuit includes a delay-locked loop circuit configured to receive the first clock signal, and generate a second clock signal obtained by delaying the first clock signal; a first duty cycle correction circuit configured to receive the second clock signal, and generate a first correction clock signal obtained by correcting a duty cycle of the second clock signal; and a first duty cycle detection circuit configured to receive the first correction clock signal, generate a first error code as to whether to correct the duty cycle of the second clock signal on the basis of the first correction clock signal, and generate a second error code different from the first error code on the basis of the first error code and the first correction clock signal without the use of the first duty cycle correction circuit, wherein the first duty cycle correction circuit receives the second error code, and generates the output clock signal obtained by correcting the duty cycle of the second clock signal in response to the second error code.

Other variations and embodiments may be apparent from the following detailed description, the drawings and the claims.

BRIEF DESCRIPTION OF THE DRAWINGS

The above and other embodiments of the present disclosure will become more apparent by considering in detail embodiments thereof with reference to the attached drawings, in which.

DETAILED DESCRIPTION

Hereinafter, embodiments of the present disclosure will be described with reference to the accompanying drawings.

Figure 1:
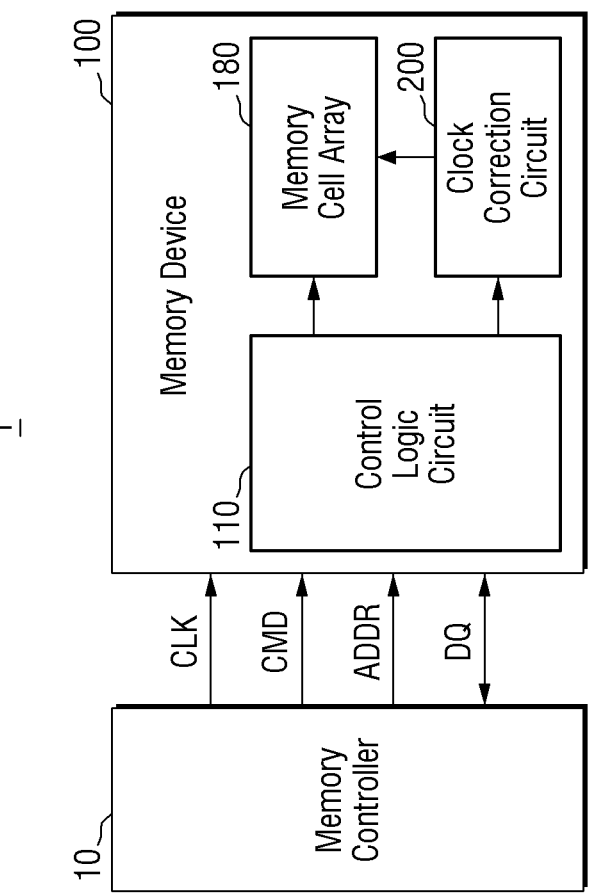
FIG. 1 is a block diagram of a memory system according to some embodiments.

FIG. 1 illustrates a memory system according to an embodiment.

Referring to FIG. 1, a memory system 1 may include a memory controller 10 and a memory device 100.

The memory controller 10 may generally control the operation of the memory system 1. For example, the memory controller 10 may control a data exchange between an external host and the memory device 100. Moreover, the memory controller 10 may control the memory device 100 in accordance with a request from a host, thereby writing or reading data.

The memory controller 10 may control the operation of the memory device 100 by applying a command CMD for controlling the memory device 100. Here, the memory device 100 may include dynamic memory cells. For example, the memory device 100 may include a dynamic random-access memory (DRAM), a double data rate 4 (DDR4) synchronous DRAM (SDRAM), a low power DDR4 (LPDDR4) SDRAM, a LPDDR5 SDRAM, and the like. However, embodiments according to the present disclosure are not limited thereto, and the memory device 100 may also include a non-volatile memory device.

The memory controller 10 may transmit a clock signal CLK, a command CMD, an address ADDR, and the like to the memory device 100. The memory controller 10 may provide data DQ to the memory device 100, and may retrieve the data DQ from the memory device 100. The memory device 100 may include a memory cell array 180 in which the data DQ is stored, a control logic circuit 110, a clock correction circuit 200, and the like.

The clock correction circuit 200 may generate a clock signal obtained by correcting the clock signal CLK and provide it to the memory device 100. The control logic circuit 110 may control an access to the memory cell array 180 and control the operation of the clock correction circuit 200, on the basis of the command CMD and the address ADDR.

Figure 2:
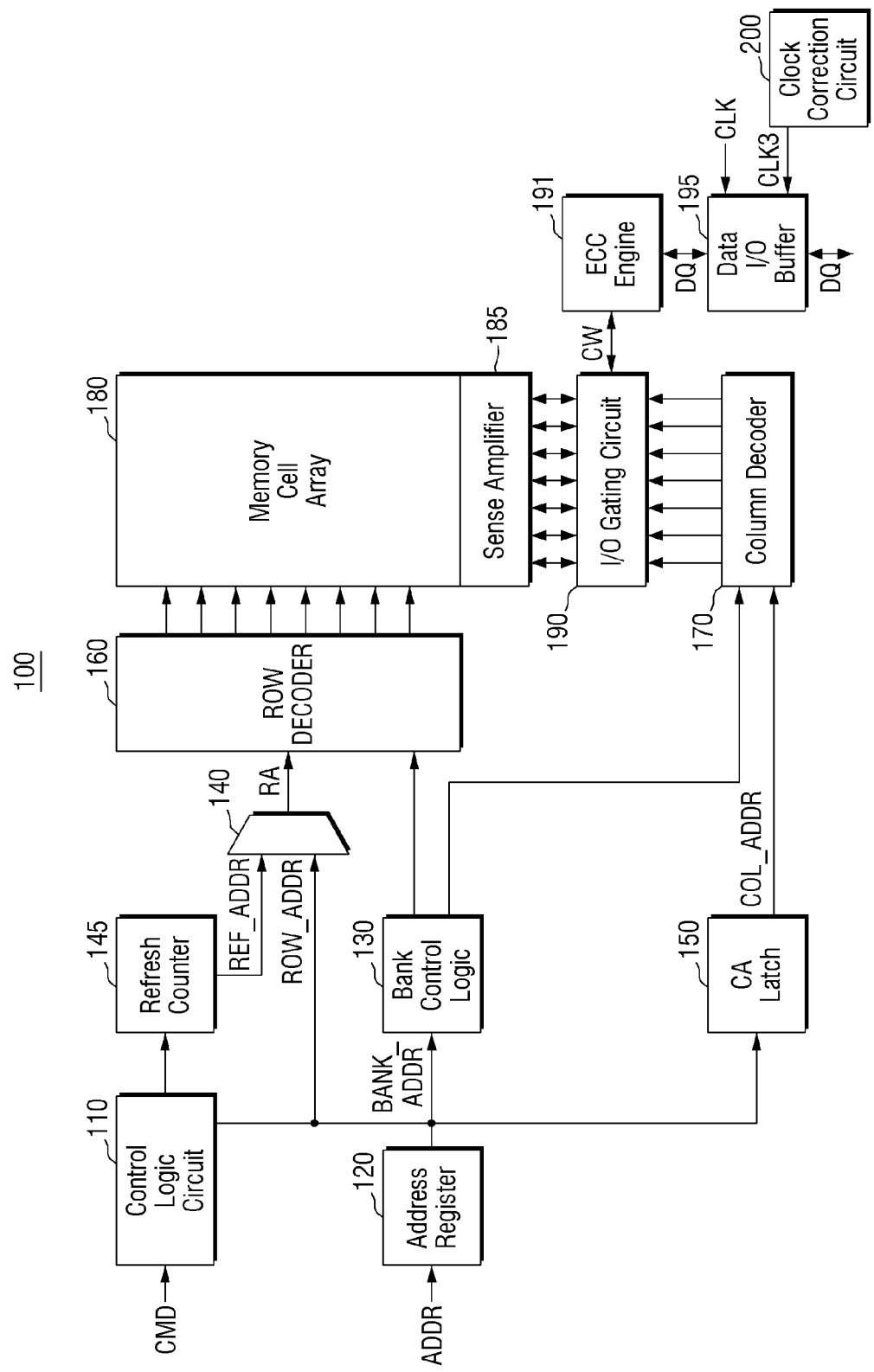
FIG. 2 is a block diagram of a memory device according to some embodiments.

FIG. 2 illustrates a memory device according to an embodiment.

Referring to FIG. 2, the memory device 100 includes a control logic circuit 110, an address register 120, a bank control logic circuit 130, a row address multiplexer 140, a refresh counter 145, a column address latch 150, a row decoder 160, a column decoder 170, a memory cell array 180, a sense amplifier 185, a I/O gating circuit 190, an ECC engine 191, a data I/O buffer 195, a clock correction circuit 200, and the like.

The memory cell array 180 may include a plurality of bank arrays. The row decoder 160 may be connected to the plurality of bank arrays. The column decoder 170 may be connected to the plurality of bank arrays through the I/O gating circuit 190. The sense amplifier 185 may be connected to each of the plurality of bank arrays. The memory cell array 180 may include a plurality of word lines, a plurality of bit lines, and a plurality of memory cells formed substantially at intersections between the word lines and the bit lines.

The address register 120 may receive the address ADDR from the memory controller 10. The address ADDR may include a bank address BANK_ADDR, a row address ROW_ADDR, a column address COL_ADDR, and the like. The address register 120 may provide the bank address BANK_ADDR to the bank control logic circuit 130. The address register 120 may provide the row address ROW_ADDR to the row address multiplexer 140. The address register 120 may provide the column address COL_ADDR to the column address latch 150.

The bank control logic circuit 130 may generate a bank control signal in response to the bank address BANK_ADDR. The row decoder 160 may be activated in response to the bank control signal. Also, the column decoder 170 may be activated in response to the bank control signal corresponding to the bank address BANK_ADDR.

The row address multiplexer 140 may receive a row address ROW_ADDR from the address register 120, and receive a refresh row address REF_ADDR from the refresh counter 145. The row address multiplexer 140 may select one of the row address ROW_ADDR or the refresh row address REF_ADDR, and output it to the row address RA. The row address RA may be transferred to the row decoder 160.

The refresh counter 145 may sequentially output a refresh row address REF_ADDR according to the control of the control logic circuit 110.

The row decoder 160 activated by the bank control logic circuit 130 may decode the row address RA that is output from the row address multiplexer 140 to activate the word line corresponding to the row address RA. For example, the row decoder 160 may apply a word line driving voltage to the word line corresponding to the row address RA.

The column address latch 150 may receive the column address COL_ADDR from the address register 120, and temporarily store the received column address COL_ADDR. The column address latch 150 may gradually increase the column address COL_ADDR received in a burst mode. The column address latch 150 may provide the column decoder 170 with the temporarily stored column address or the gradually increased column address as the column address COL_ADDR.

The column decoder 170 activated by the bank control logic circuit 130 may activate the sense amplifier 185 corresponding to the bank address BANK_ADDR and the column address COL_ADDR through the corresponding I/O gating circuit 190.

The I/O gating circuit 190 may include a circuit that gates the I/O data, input data mask logic, read data latches that store the data output from the memory cell array 180, and write drivers that write the data into the memory cell array 180.

A code word CW that is read from a bank array of the memory cell array 180 may be detected by the sense amplifier 185 corresponding to the bank array. The code word CW may be stored in a read data latch of the I/O gating circuit 190. The code word CW stored in the read data latch may be subjected to ECC-decoding by the ECC engine 191, and the data DQ subjected to the ECC-decoding may be provided to the memory controller 10 through the data I/O buffer 195.

The data I/O buffer 195 may provide the data DQ to the ECC engine 191 on the basis of the clock signal CLK in the writing operation. The data I/O buffer 195 may provide the data DQ provided from the ECC engine 191 to the memory controller 10 on the basis of a third clock signal CLK3 provided from the clock correction circuit 200 in the reading operation.

The clock correction circuit 200 may receive a clock signal CLK, correct the clock signal CLK, and generate the third clock signal CLK3. The clock correction circuit 200 may provide the third clock signal CLK3 to the data I/O buffer 195.

The clock correction circuit 200 according to embodiments of the present disclosure will be described below with reference to FIGS. 3 through 11.

Figure 3:
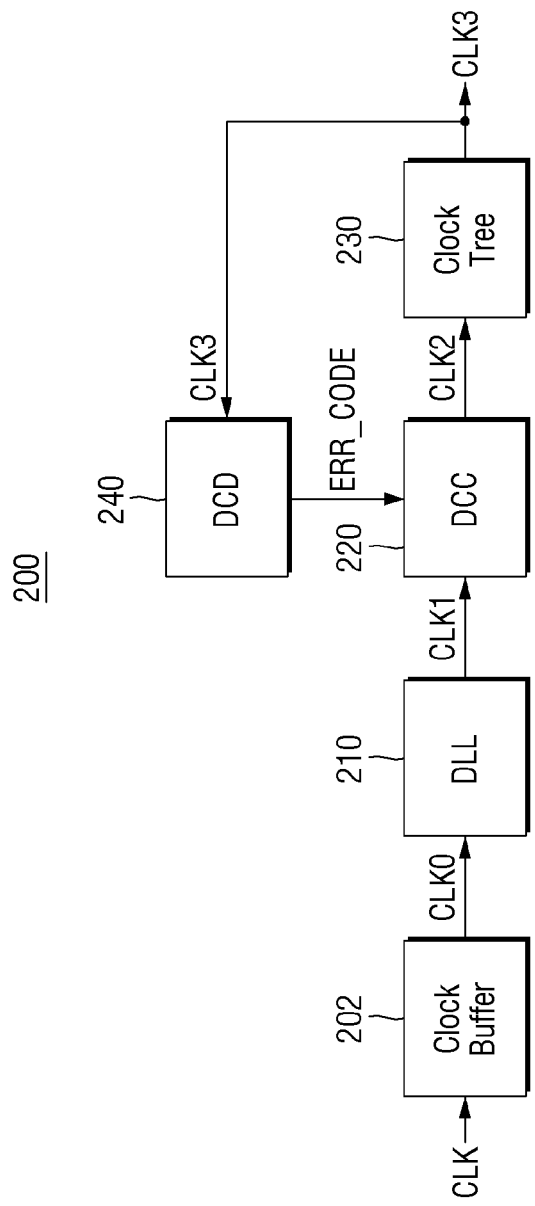
FIG. 3 is a block diagram of the clock correction circuit according to some embodiments.
Figure 4:
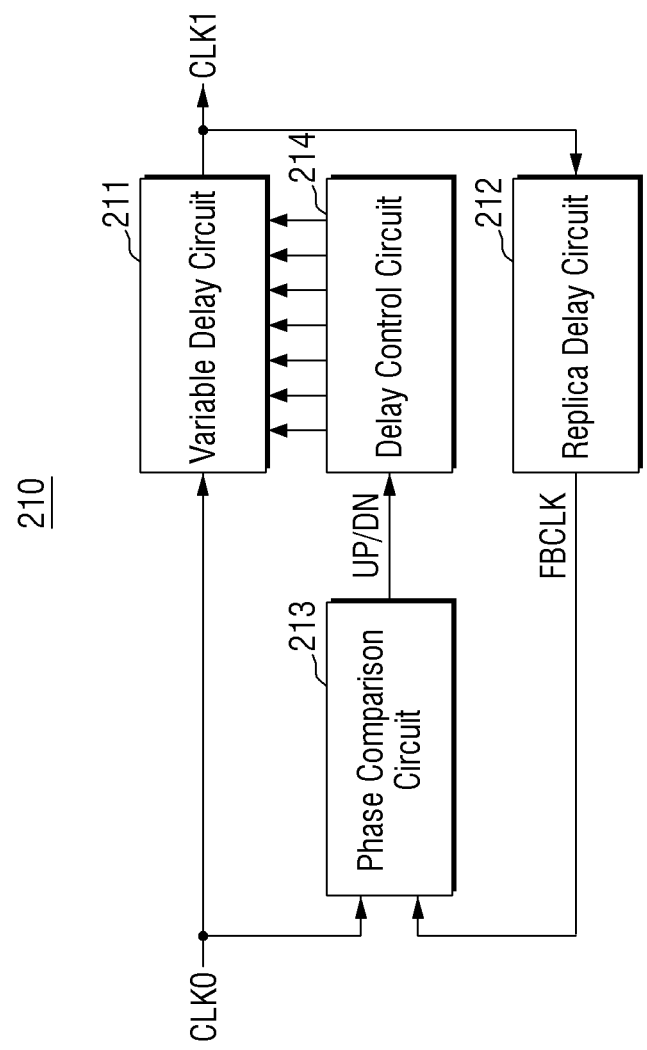
FIG. 4 is a block diagram of the delay-locked loop circuit of FIG. 3.
Figure 5:
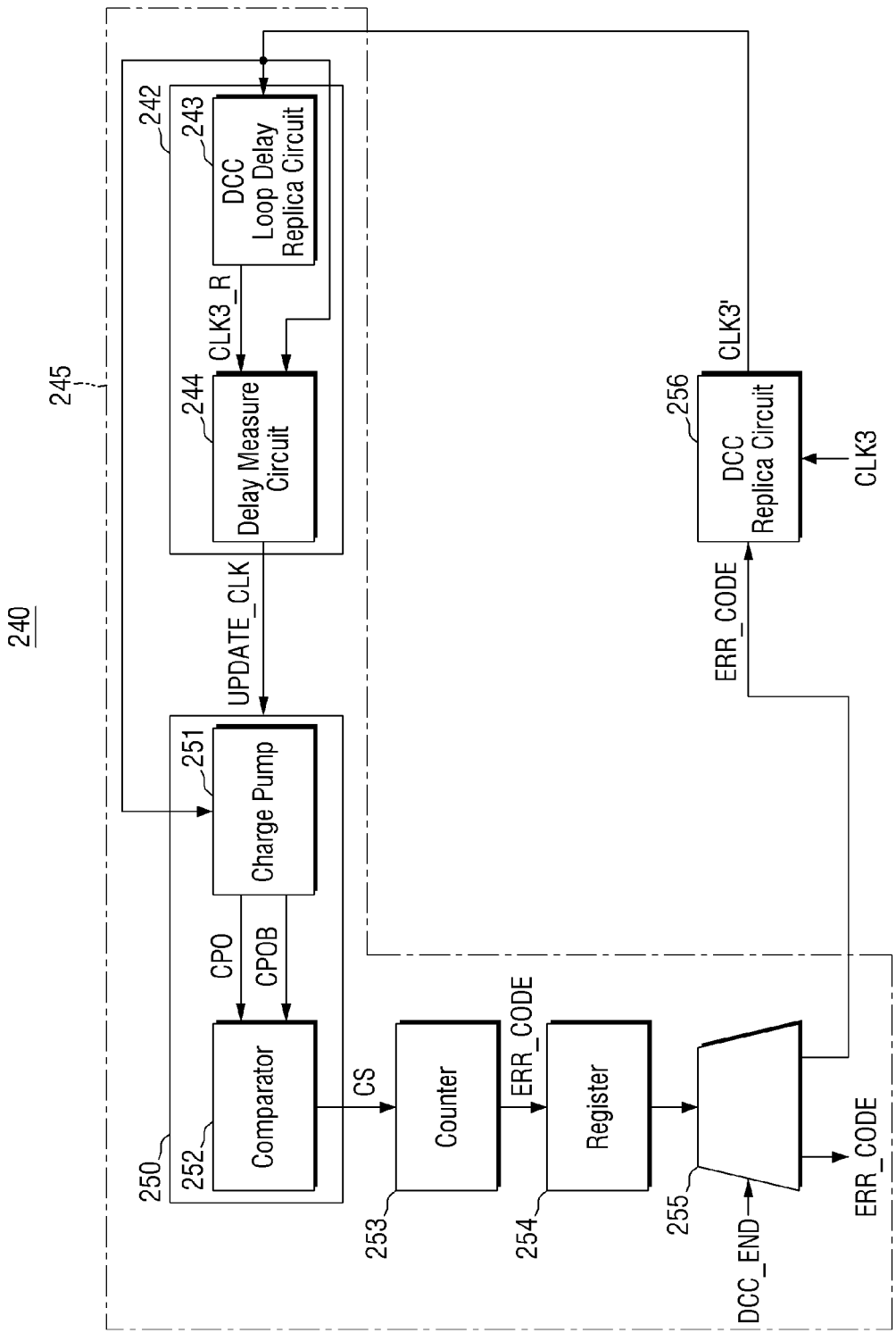
FIG. 5 is a block diagram of the duty cycle detection circuit of FIG. 3.

FIG. 3 illustrates a clock correction circuit according to an embodiment. FIG. 4 illustrates the delay-locked loop (DLL) circuit of FIG. 3. FIG. 5 illustrates the duty cycle detection circuit of FIG. 3.

Referring to FIG. 3, the clock correction circuit 200 may include a clock buffer 202, a delay-locked loop circuit 210, a duty cycle correction (DCC) circuit 220, a clock tree 230, and a duty cycle detection (DCD) circuit 240.

The clock buffer 202 may receive the clock signal CLK from the memory controller 10. The clock buffer 202 may temporarily store the clock signal CLK. The clock buffer 202 may output the stored clock signal CLK as a clock signal CLK0. Here, the clock signal CLK0 may be substantially the same as the clock signal CLK. Although the clock buffer 202 is shown as being connected to the delay-locked loop circuit 210 in the drawing, embodiments of the present disclosure are not limited thereto, and the clock buffer 202 may be omitted.

The delay-locked loop circuit 210 may receive the clock signal CLK0 from the clock buffer 202. The delay-locked loop circuit 210 may delay the clock signal CLK0. For example, the delay-locked loop circuit 210 may delay the clock signal CLK0 by a first time interval. Accordingly, the delay-locked loop circuit 210 may generate the first clock signal CLK1 obtained by delaying the clock signal CLK0.

Referring to FIG. 4, the delay-locked loop circuit 210 may include a variable delay circuit 211, a replica delay circuit 212, a phase comparison circuit 213, and a delay control circuit 214.

The replica delay circuit 212 may output the feedback clock signal FBCLK by delaying the first clock signal CLK1 which is an output clock signal of the delay-locked loop circuit 210. The replica delay circuit 212 may calculate a delay amount obtained by modeling the delay elements in which the first clock signal CLK1 of the delay-locked loop circuit 210 is output from the delay-locked loop circuit 210 and passes through the memory device 100. That is, the feedback clock signal FBCLK may correspond to a clock signal to which the delay amount modeled in the first clock signal CLK1 is added.

The phase comparison circuit 213 may compare the phase of the clock signal CLK0, which is an input clock signal of the delay-locked loop circuit 210, with the phase of the feedback clock signal FBCLK. As a result, the phase comparison circuit 213 may output an up/down signal (UP/DN) indicating which phase of the clock signal CLK0 and the feedback clock signal FBCLK precedes the other.

The delay control circuit 214 may perform a control so that the delay value of the variable delay circuit 211 increases or decreases in response to the up/down signal (UP/DN). The variable delay circuit 211 may delay the clock signal CLK0 on the basis of the delay value controlled by the delay control circuit 214. Accordingly, the variable delay circuit 211 may output the first clock signal CLK1.

The delay control circuit 214 may determine whether to lock the delay-locked loop circuit 210, using the up/down signal (UP/DN) that is output from the phase comparison circuit 213. For example, when the phase of the first clock signal CLK1 precedes and then falls behind the phase of the clock signal CLK0, or when the phase of the first clock signal CLK1 falls behind and then precedes the phase of the clock signal CLK0, the delay-locked loop circuit 210 may be determined to be locked.

Referring to FIG. 3 again, the duty cycle correction circuit 220 may receive the first clock signal CLK1. That is, the duty cycle correction circuit 220 may receive the first clock signal CLK1 locked by the delay-locked loop circuit 210.

The duty cycle correction circuit 220 may correct the duty cycle of the first clock signal CLK1 in response to the error code ERR_CODE. For example, the duty cycle of the first clock signal CLK1 that is output from the delay-locked loop circuit 210 might not be optimal. For example, the duty cycle of the clock signal may be optimal when it is 50%, without limitation thereto. But the duty cycle of the first clock signal CLK1 may be greater than or smaller than optimal (e.g., 50%). In this case, the duty cycle correction circuit 220 may correct the duty cycle of the first clock signal CLK1 so that the duty cycle of the first clock signal CLK1 is in an optimal state.

The error code ERR_CODE may be information about whether to correct the duty cycle of the first clock signal CLK1 or the third clock signal CLK3. For example, when the duty cycle of the first clock signal CLK1 is 40%, the error code ERR_CODE may correspond to information in which the duty cycle of the first clock signal CLK1 or the third clock signal CLK3 is increased by 10%. The duty cycle correction circuit 220 may generate a second clock signal CLK2 by correcting the duty cycle of the first clock signal CLK1. The duty cycle correction circuit 220 may provide the second clock signal CLK2 to the clock tree 230.

The clock tree 230 may be configured as a clock tree distribution network to receive the second clock signal CLK2 and provide it or a responsive clock signal to the duty cycle detection circuit 240 and to the data I/O buffer 195 of FIG. 2. For example, the clock tree 230 may provide a third clock signal CLK3 to the duty cycle detection circuit 240 and the data I/O buffer 195. Although the third clock signal CLK3 may be substantially the same as the second clock signal CLK2, embodiments of the present disclosure are not limited thereto.

A specific time may elapse or be used until the second clock signal CLK2 reaches the duty cycle detection circuit 240 via the clock tree 230. For example, there may be time until the second clock signal CLK2 reaches the clock tree 230, the clock tree 230 processes the second clock signal CLK2, and the clock tree 230 transfers the third clock signal CLK3 to the duty cycle detection circuit 240.

The duty cycle detection circuit 240 may generate an error code ERR_CODE that indicates whether to correct the duty cycle of the first clock signal CLK1 or the third clock signal CLK3, on the basis of the third clock signal CLK3. The duty cycle detection circuit 240 may provide the error code ERR_CODE to the duty cycle correction circuit 220 as feedback.

Referring to FIG. 5, the duty cycle detection circuit 240 may include an error code generation circuit 245 and a duty cycle correction replica circuit (DCC replica circuit) 256. The error code generation circuit 245 may include a clock generator 242, a duty cycle determination circuit 250, a counter 253, a register 254, and a determinator 255.

The clock generator 242 may include a duty cycle correction loop delay replica circuit 243 and a delay measurement circuit 244. The duty cycle determination circuit 250 may include a charge pump 251 and a comparator 252.

Figure 6:
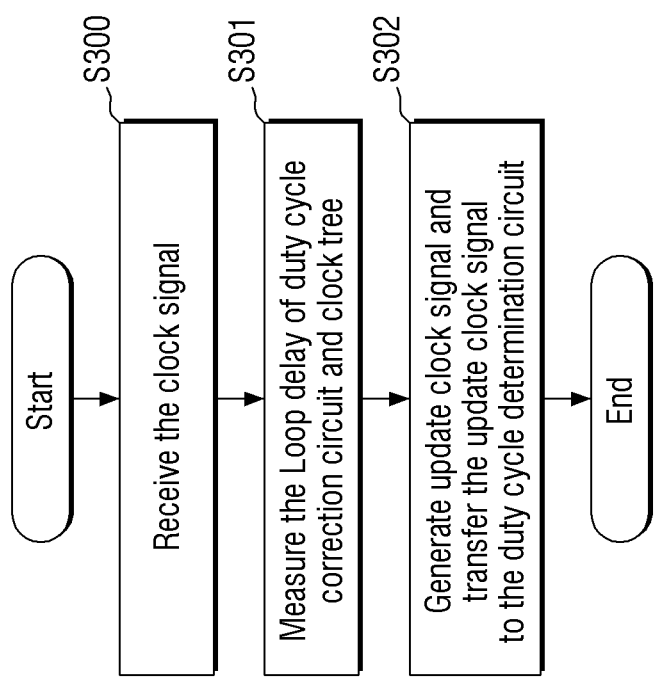
FIG. 6 is a flowchart diagram for explaining the operation of the clock generator according to some embodiments.
Figure 7:
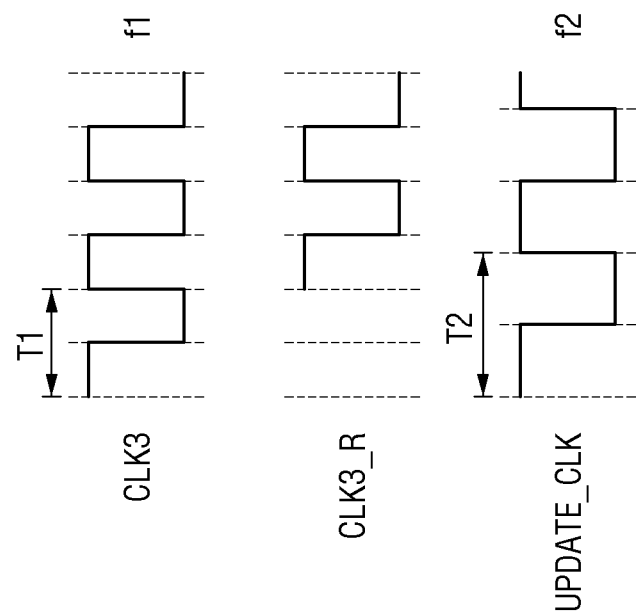
FIG. 7 is a timing diagram for explaining the operation of the clock generator according to some embodiments.

FIG. 6 illustrates operation of a clock generator according to an embodiment. FIG. 7 illustrates operation of a clock generator according to an embodiment.

Referring to FIGS. 5 to 7, the duty cycle correction loop delay replica circuit 243 may receive a third clock signal CLK3 or a third clock signal CLK3' (S300). For example, the third clock signal CLK3 may have a first cycle period T1 and a first frequency f1. The first cycle period T1 and the first frequency f1 may be in an inversely proportional relationship to each other. That is, the third clock signal CLK3 may be a clock signal that is repeated each first cycle period T1. Also, the frequencies of the clock signal CLK and the clock signal CLK0 may be substantially the first frequency f1. Moreover, the cycle periods of the clock signal CLK and the clock signal CLK0 may be substantially the first cycle period T1. However, embodiments of the present disclosure are not limited thereto.

The delay measurement circuit 244 of the duty cycle detection circuit 240 may measure the amount of loop delay in the duty cycle correction circuit 220 and the clock tree 230 (S301). For example, the duty cycle correction loop delay replica circuit 243 may calculate the amount of delay obtained by modeling the delay elements until the first clock signal CLK1 reaches the clock generator 242 via the duty cycle correction circuit 220 and the clock tree 230.

The duty cycle correction loop delay replica circuit 243 may output a clock signal CLK3_R. The clock signal CLK3_R may be a clock signal reformed on the basis of the amount of delay obtained by modeling the third clock signal CLK3. That is, the clock signal CLK3_R may be a signal which is delayed by the amount of delay modeled by the third clock signal CLK3.

Referring to FIG. 7, the clock signal CLK3_R may have a phase different from that of the third clock signal CLK3. However, the clock signal CLK3_R shown in FIG. 7 is merely an example, and embodiments of the present disclosure are not limited thereto.

Referring to FIGS. 5 and 6 again, the clock generator 242 may generate an update clock signal UPDATE_CLK and transfer the generated update clock signal UPDATE_CLK to the duty cycle determination circuit 250 (S302).

The delay measurement circuit 244 may receive the clock signal CLK3_R from the duty cycle correction loop delay replica circuit 243, and receive the third clock signal CLK3' from the duty cycle correction replica circuit 256. The delay measurement circuit 244 may generate an update clock signal UPDATE_CLK on the basis of the clock signal CLK3_R and the third clock CLK3'.

Referring to FIG. 7, the update clock signal UPDATE_CLK may have a second cycle period T2 and a second frequency f2. The second cycle period T2 and the second frequency f2 may be in an inversely proportional relationship to each other. That is, the update clock signal UPDATE_CLK may be a clock signal that is repeated each second cycle period T2.

The second cycle period T2 of the update clock signal UPDATE_CLK may be greater than the first cycle period T1 of the third clock signal CLK3. Also, the second frequency f2 of the update clock signal UPDATE_CLK may be smaller than the first frequency f1 of the third clock signal CLK3. That is, the number of clock cycles of the update clock signals UPDATE_CLK that arrive within the same time may be smaller than the number of clock cycles of the third clock signal CLK3. However, embodiments of the present disclosure are not limited thereto, and the first cycle period T1 and the second cycle period T2 may be the same.

Figure 8:
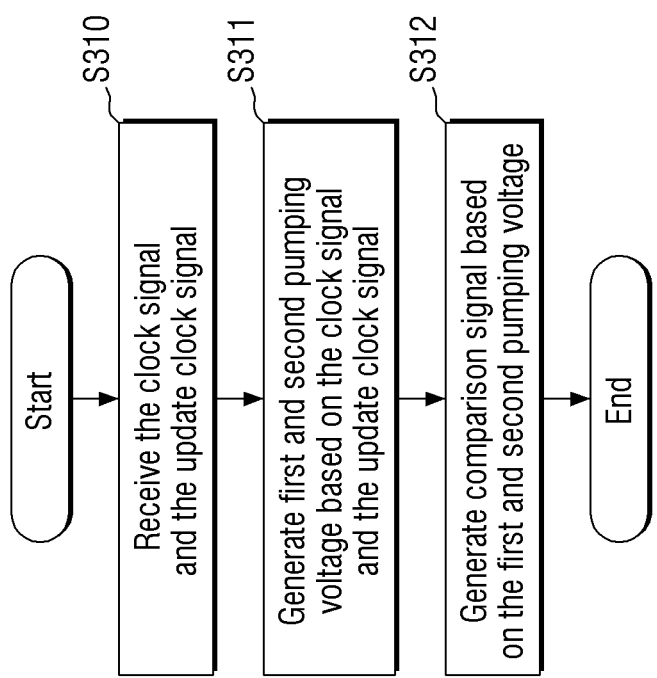
FIG. 8 is a flowchart diagram for explaining the operation of the duty cycle determination circuit according to some embodiments.

FIG. 8 illustrates operation of a duty cycle determination circuit according to an embodiment.

Referring to FIGS. 5 and 8, the duty cycle determination circuit 250 may receive the update clock signal UPDATE_CLK from the clock generator 242, and receive the third clock signal CLK3' from the duty cycle correction replica circuit 256 (S310). The duty cycle determination circuit 250 may determine whether to correct the duty cycle of the third clock signal CLK3 on the basis of the update clock signal UPDATE_CLK.

The duty cycle determination circuit 250 may include a charge pump 251 and a comparator 252. The charge pump 251 may generate a first pumping voltage CPO and a second pumping voltage CPOB on the basis of the third clock signal CLK3' and the update clock signal UPDATE_CLK (S311). The charge pump 251 may pump the third clock signal CLK3'. That is, the charge pump 251 may amplify the third clock signal CLK3' and convert it to a higher level or a lower level. The first pumping voltage CPO and the second pumping voltage CPOB may have phases opposite to each other.

The first pumping voltage CPO and the second pumping voltage CPOB amplified by the charge pump 251 may be amplified for comparison with each other. Here, although an amplified ratio may be set in advance, embodiments of the present disclosure are not limited thereto.

The comparator 252 may receive the first pumping voltage CPO and the second pumping voltage CPOB from the charge pump 251. The comparator 252 may generate a comparison signal CS on the basis of the first pumping voltage CPO and the second pumping voltage CPOB (S312).

The comparator 252 may test the duty cycle of the third clock signal CLK3 by comparing the first pumping voltage CPO and the second pumping voltage CPOB with each other. The comparator 252 may output information on the duty cycle of the third clock signal CLK3 as the comparison signal CS, which is an analog signal. However, embodiments of the present disclosure are not limited thereto, and information on the duty cycle of the third clock signal CLK3 may be a comparison signal CS which is a digital signal.

For example, when the duty cycle of the third clock signal CLK3 is 40%, the comparison signal CS may include information that the duty cycle of the third clock signal CLK3 is 40%. Further, for example, when the duty cycle of the third clock signal CLK3 is 60%, the comparison signal CS may include information that the duty cycle of the third clock signal CLK3 is 60%.

Figure 9:
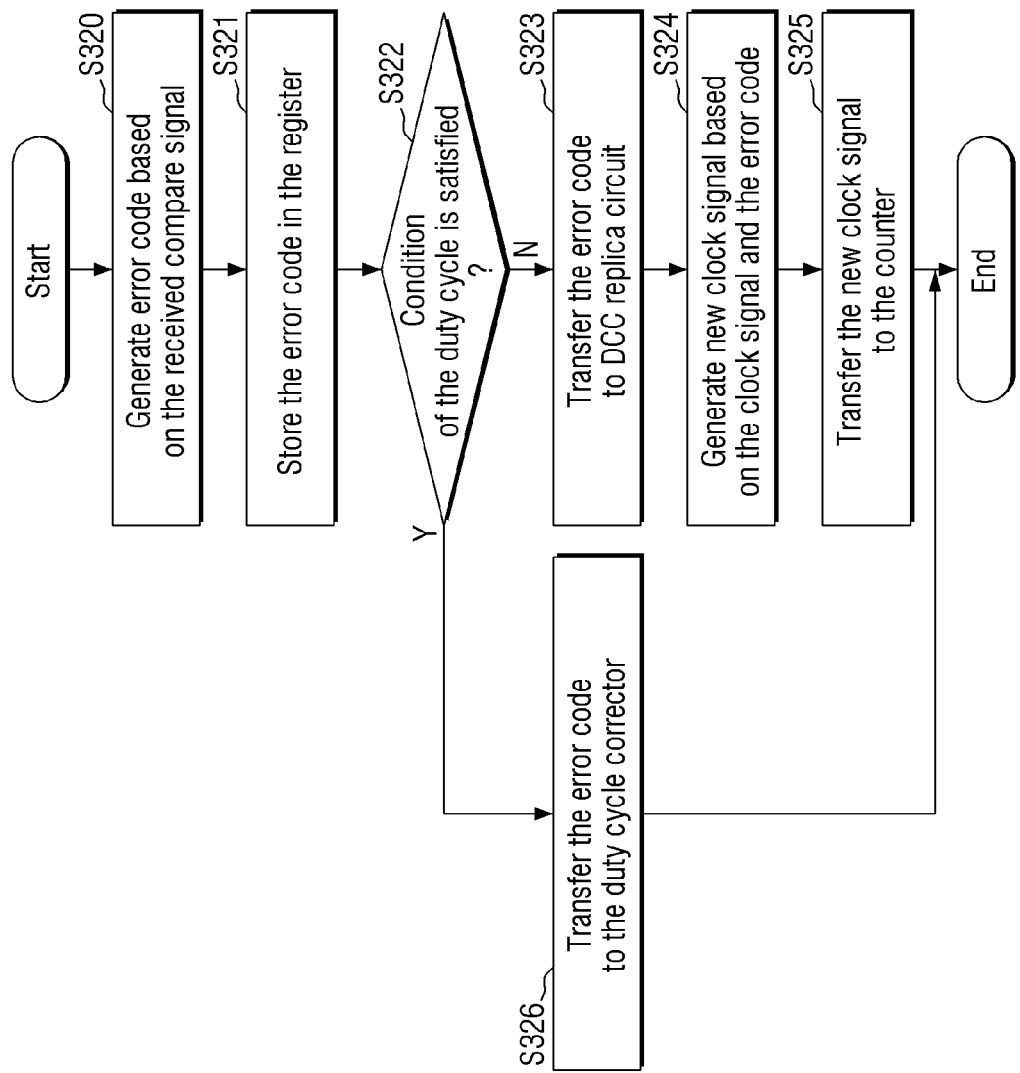
FIG. 9 is a flowchart diagram for explaining the operation of the duty cycle detection circuit according to some embodiments.
Figure 10:
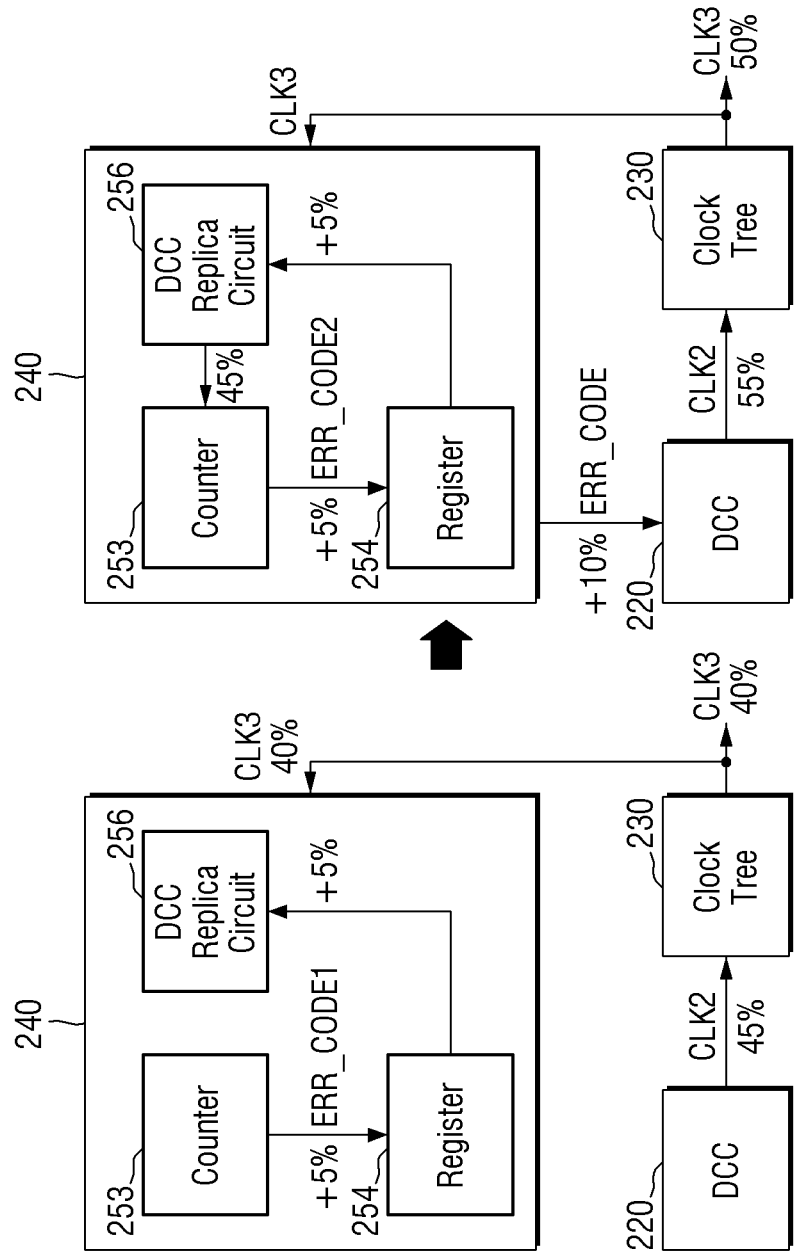
FIG. 10 is a hybrid diagram for explaining the operation of the duty cycle detection circuit according to some embodiments.

FIG. 9 illustrates operation of a duty cycle detection circuit according to an embodiment. FIG. 10 illustrates operation of a duty cycle detection circuit according to an embodiment.

Referring to FIGS. 5 and 9, the counter 253 may generate an error code ERR_CODE on the basis of the comparison signal CS received from the comparator 252 (S320). The counter 253 may receive the comparison signal CS to generate the error code ERR_CODE. The counter 253 may generate the error code ERR_CODE by determining whether the duty cycle of the third clock signal CLK3 satisfies a preset condition. The error code ERR_CODE may include information about whether to correct the duty cycle of the third clock signal CLK3. For example, the error code ERR_CODE may include information about the correction degree of the duty cycle of the third clock signal CLK3.

For example, the counter 253 may generate the error code ERR_CODE until the duty cycle substantially reaches 50%. The error code ERR_CODE may be a signal for increasing or decreasing the duty cycle of the third clock signal CLK3. For example, when the duty cycle of the third clock signal CLK3 is smaller than 50%, the error code ERR_CODE may be a signal for increasing the duty cycle of the third clock signal CLK3.

When the duty cycle initially reaches 50%, the counter 253 may determine the third clock signal CLK3 at that time as a voltage having an optimal margin. At this time, the counter 253 no longer generates an error code ERR_CODE and need not convert the third clock signal CLK3.

The error code ERR_CODE received from the counter 253 may be stored in the register 254 (S321). The register 254 may temporarily store the error code ERR_CODE. However, embodiments of the present disclosure are not limited thereto, and the register 254 may cumulatively store the received error code ERR_CODE. The counter 253 may provide the error code ERR_CODE to the determinator 255.

The determinator 255 may determine whether the condition of the duty cycle of the third clock signal CLK3 is satisfied (S322). The determinator 255 may determine whether the duty cycle of the third clock signal CLK3 satisfies a certain condition on the basis of the error code ERR_CODE. For example, the determinator 255 may determine whether the duty cycle of the third clock signal CLK3 satisfies the condition in which it is greater than 50% and then becomes smaller than 50%, and the condition in which it is smaller than 50% and then becomes greater than 50%.

When the duty cycle of the third clock signal CLK3 satisfies a certain condition (S322-Y), the determinator 255 may transfer the error code ERR_CODE to the duty cycle correction circuit 220 (S326).

When the duty cycle of the third clock signal CLK3 does not satisfy a certain condition (S322-N), the determinator 255 may transfer the error code ERR_CODE to the duty cycle correction replica circuit 256 (S323).

Here, the duty cycle correction replica circuit 256 may be included in the duty cycle detection circuit 240. The duty cycle correction replica circuit 256 may have substantially the same structure as that of the duty cycle correction circuit 220. However, embodiments of the present disclosure are not limited thereto, and the duty cycle correction replica circuit 256 may have a structure different from that of the duty cycle correction circuit 220.

The duty cycle correction replica circuit 256 and the duty cycle correction circuit 220 may have different configurations from each other. For example, the duty cycle correction circuit 220 may be placed in the clock correction circuit 200 and separated from the duty cycle detection circuit 240. However, the duty cycle correction replica circuit 256 may be placed inside the duty cycle detection circuit 240. That is, the duty cycle correction replica circuit 256 and the duty cycle correction circuit 220 may be implemented separately from each other.

The duty cycle correction replica circuit 256 may generate a new third clock signal CLK3' on the basis of the error code ERR_CODE and the third clock signal CLK3 (S324). The duty cycle correction replica circuit 256 may correct the duty cycle of the third clock signal CLK3 in response to the error code ERR_CODE. For example, the duty cycle correction replica circuit 256 may correct the duty cycle of the third clock signal CLK3 so that the duty cycle of the third clock signal CLK3 is in an optimal state. The generated new third clock signal CLK3' may be provided to the error code generation circuit 245, the new third clock signal CLK3' is transferred to the clock generator 242 and the duty cycle determination circuit 250, and the error code ERR_CODE may be generated again.

Referring to FIG. 10, when the duty cycle of the third clock signal CLK3 is 40%, the error code ERR_CODE1 thereof may be +5%. The duty cycle correction replica circuit 256 may receive the error code ERR_CODE1 of +5%, and generate a clock signal obtained by correcting the duty cycle of the third clock signal CLK3.

The duty cycle correction replica circuit 256 may provide the counter 253 with a clock signal which is corrected to have a duty cycle of 45% (S325 of FIG. 9). The counter 253 may generate an error code ERR_CODE2 including information in which the duty cycle is increased by 5%. The register 254 may store the error code ERR_CODE2.

The determinator 255 may determine whether the corrected clock signal has the optimum duty cycle, on the basis of the third clock signal CLK3, the error code ERR_CODE1 and the error code ERR_CODE2. When the corrected clock signal has the optimum duty cycle, the determinator 255 may provide the error code ERR_CODE to the duty cycle correction circuit 220. In this case, the determinator 255 may provide the error code ERR_CODE to the duty cycle correction circuit 220, by receiving the end signal DCC_END.

Here, the error code ERR_CODE may include information in which the duty cycle is increased by 10%. That is, the error code ERR_CODE may include information about both the error code ERR_CODE1 and the error code ERR_CODE2. However, embodiments of the present disclosure are not limited thereto.

The duty cycle correction circuit 220 may receive the error code ERR_CODE. The duty cycle correction circuit 220 may generate a second clock signal CLK2 by correcting the duty cycle of the first clock signal CLK1 on the basis of the error code ERR_CODE. Also, the clock tree 230 may receive the second clock signal CLK2 to output the third clock signal CLK3. The clock tree 230 may be configured as a clock tree distribution network which may have an additional effect on duty cycle. While the embodiment of FIG. 10 shows a 5% reduction in duty cycle through the clock tree 230 for CLK3 versus CLK2, embodiments are not limited thereto. For example, some embodiments of the clock tree 230 may have negligible effect on duty cycle, while others may have a more variable effect. Moreover, the clock tree 230 may be omitted from yet other embodiments.

Although the duty cycle of the third clock signal CLK3 before the duty cycle correction was 40%, the duty cycle of the third clock signal CLK3 after the duty cycle correction may be 50%. That is, the first clock signal CLK1 is corrected on the basis of the error code ERR_CODE provided from the duty cycle detection circuit 240, and the duty cycle of the second clock signal CLK2 may accordingly be 55%. Also, the duty cycle of the third clock signal CLK3 may be 50%. That is, the duty cycle of the third clock signal CLK3 that is output from the clock correction circuit 200 may have an optimal state.

The third clock signal CLK3 may use as much time as the time for transfer from the duty cycle correction circuit 220 to the duty cycle detection circuit 240 via the clock tree 230. That is, a certain amount of time may be used in a feedback process in which the error code ERR_CODE is output from the duty cycle detection circuit 240 and transferred again to the duty cycle detection circuit 240.

However, since the duty cycle detection circuit 240 includes the duty cycle correction replica circuit 256, it is possible to eliminate the time at which the error code ERR_CODE is output from the duty cycle detection circuit 240 and is input to the duty cycle detection circuit 240 again via the clock tree 230. That is, since the error code ERR_CODE is transferred and the corrected clock signal is generated inside the duty cycle detection circuit 240, more duty cycle corrections may be performed within a limited time. Therefore, the accuracy of the duty cycle correction can be increased.

Figure 11:
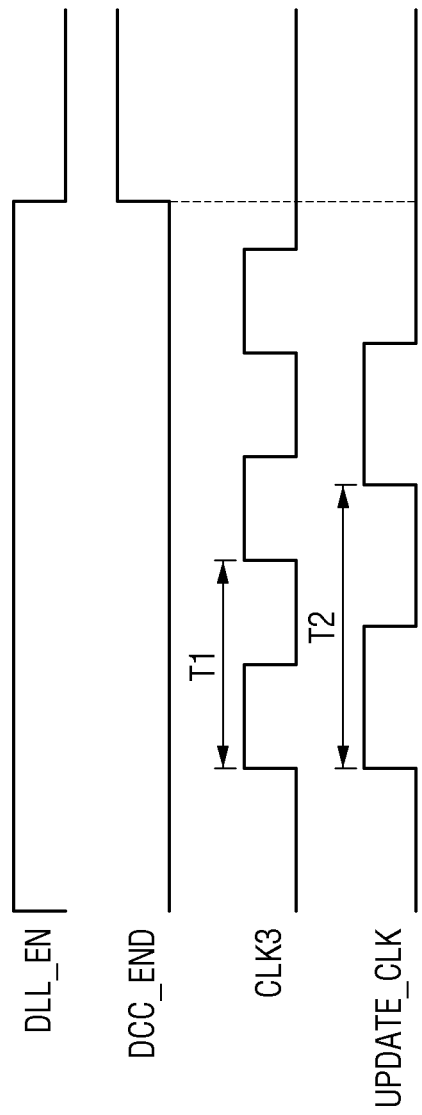
FIG. 11 is a timing diagram for explaining the operation of the duty cycle detection circuit according to some embodiments.

FIG. 11 illustrates operation of a duty cycle detection circuit according to an embodiment.

Referring to FIG. 11, an operation of the delay-locked loop circuit 210 may be performed by a delay-locked loop enable signal DLL_EN. That is, when the delay-locked loop enable signal DLL_EN is turned on, the delay-locked loop circuit 210 may perform delay locking on the clock signal CLK0. Also, when the delay-locked loop enable signal DLL_EN is turned off, the operation of the delay-locked loop circuit 210 may be ended.

The operation of the duty cycle correction circuit 220 may be performed when the delay-locked loop enable signal DLL_EN is turned on. That is, when the delay-locked loop circuit 210 does not operate, the duty cycle correction circuit 220 need not operate. The operation of the duty cycle correction circuit 220 may be ended by an end signal DCC_END.

The third clock signal CLK3 and the update clock signal UPDATE_CLK may be generated and transferred within the time interval for which the delay-locked loop enable signal DLL_EN is turned on. The third clock signal CLK3 may have a first cycle period T1, and the update clock signal UPDATE_CLK may have a second cycle period T2. Here, the second cycle period T2 may be greater than the first cycle period T1.

Since the duty cycle detection circuit 240 operates in synchronization with the update clock signal UPDATE_CLK, the accuracy of the duty cycle correction of the duty cycle detection circuit 240 including the duty cycle correction replica circuit 256 may be further increased. That is, the accuracy of the duty cycle correction of the duty cycle detection circuit 240 may be further increased within the time interval for which the limited delay-locked loop enable signal DLL_EN is turned on.

Hereinafter, a clock correction circuit 400 according to embodiments will be described with reference to FIGS. 12 through 14.

Figure 12:
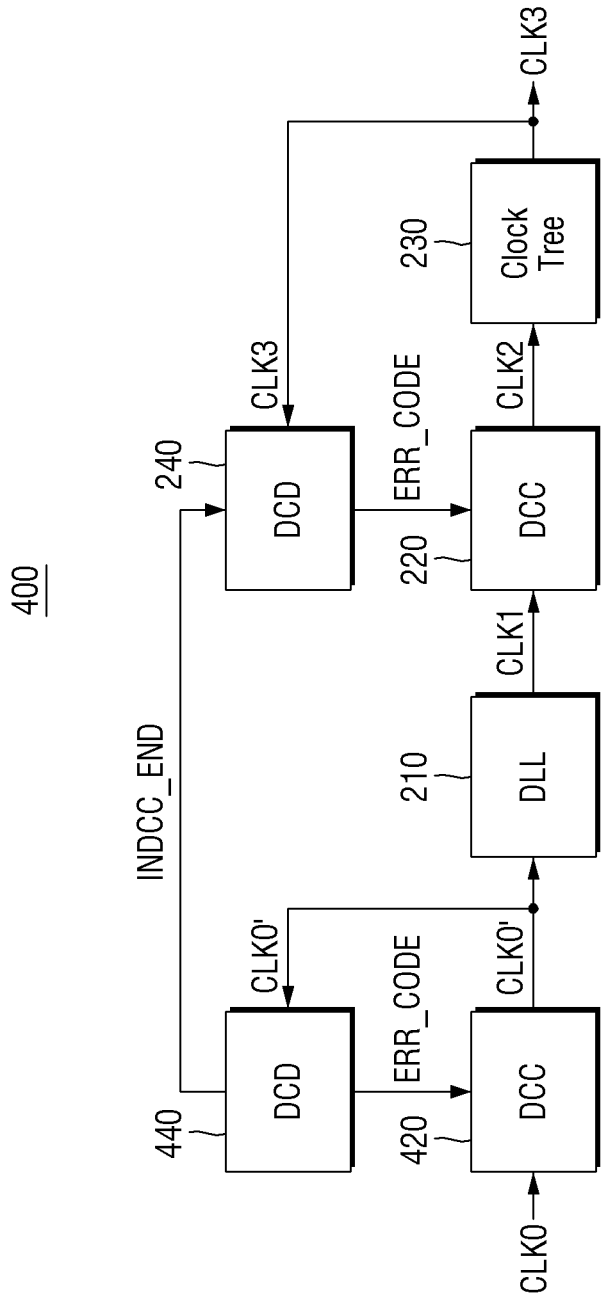
FIG. 12 is a block diagram of a clock correction circuit according to some embodiments.

FIG. 12 illustrates a clock correction circuit according to an embodiment. FIG. 13 illustrates operation of a clock correction circuit according to an embodiment. FIG. 14 illustrates operation of a clock correction circuit according to an embodiment. For convenience of explanation, embodiments and portions thereof explained using FIGS. 1 to 11 may be briefly described or omitted.

Referring to FIG. 12, the clock correction circuit 400 may include a delay-locked loop circuit 210, a duty cycle correction circuit 220, a clock tree 230, a duty cycle detection circuit 240, a second duty cycle correction circuit 420, and a second duty cycle detection circuit 440.

The delay-locked loop circuit 210 may be placed between the second duty cycle correction circuit 420 and the duty cycle correction circuit 220. The delay-locked loop circuit 210 may connect the second duty cycle correction circuit 420 and the duty cycle correction circuit 220.

The second duty cycle correction circuit 420 may receive the clock signal CLK0, and output a clock signal CLK0' obtained by correcting the duty cycle thereof. The second duty cycle correction circuit 420 may have substantially the same structure as the duty cycle correction circuit 220. The second duty cycle correction circuit 420 may output the clock signal CLK0' corrected on the basis of the error code ERR_CODE transferred from the second duty cycle detection circuit 440. The clock signal CLK0' may be provided to the delay-locked loop circuit 210 and to the second duty cycle detection circuit 440.

The second duty cycle detection circuit 440 may have substantially the same structure as that of the duty cycle detection circuit 240. The second duty cycle detection circuit 440 may generate an error code ERR_CODE on the basis of the clock signal CLK0' and provide the generated error code ERR_CODE to the second duty cycle correction circuit 420.

Figure 13:
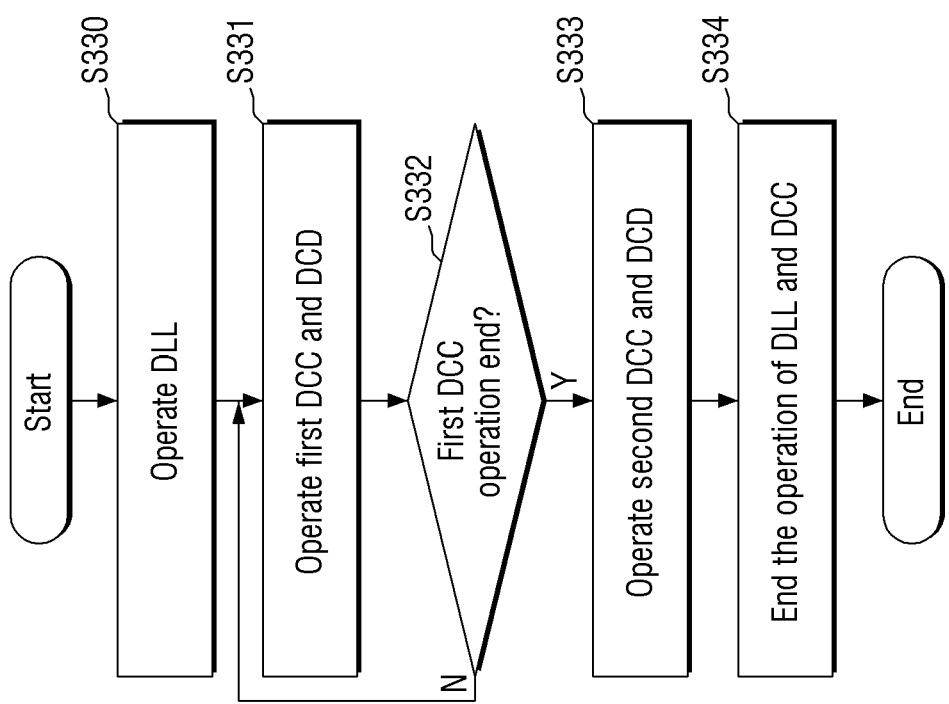
FIG. 13 is a flowchart diagram for explaining the operation of the clock correction circuit according to some embodiments.
Figure 14:
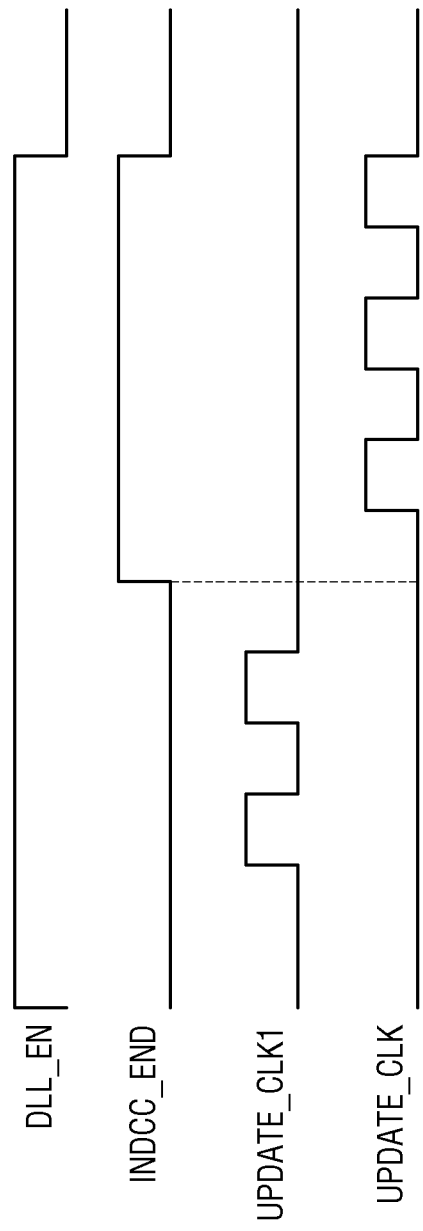
FIG. 14 is a timing diagram for explaining the operation of the clock correction circuit according to some embodiments.

Referring to FIGS. 12 to 14, the delay-locked loop circuit 210 may operate (S330). For example, the delay-locked loop circuit 210 may operate by applying the delay-locked loop enable signal DLL_EN to the delay-locked loop circuit 210.

During the operation of the delay-locked loop circuit 210, operations of the second duty cycle correction circuit 420 and the second duty cycle detection circuit 440 may be performed (S331). The second duty cycle detection circuit 440 may generate an update clock signal UPDATE_CLK1. In this case, the duty cycle of the clock signal CLK0' that is input to the delay-locked loop circuit 210 may be corrected.

The clock correction circuit 400 may determine whether the operations of the second duty cycle correction circuit 420 and the second duty cycle detection circuit 440 are ended (S332). When the operations of the second duty cycle correction circuit 420 and the second duty cycle detection circuit 440 are not ended (S332-N), the operations of the second duty cycle correction circuit 420 and the second duty cycle detection circuit 440 may continue. When the operations of the second duty cycle correction circuit 420 and the second duty cycle detection circuit 440 are ended (S332-Y), the operations of the duty cycle correction circuit 220 and the duty cycle detection circuit 240 may be performed (S333).

The second duty cycle detection circuit 440 transfers an end signal INDCC_END to the duty cycle detection circuit 240, and the duty cycle correction circuit 220 and the duty cycle detection circuit 240 may operate in response to the end signal INDCC_END.

The operations of the delay-locked loop circuit 210, the duty cycle correction circuit 220, and the duty cycle detection circuit 240 may be ended (S334). That is, as the operation of the delay-locked loop circuit 210 is ended, and the operations of the duty cycle correction circuit 220 and the duty cycle detection circuit 240 may be ended.

A clock correction circuit 401 according to an embodiment will be explained below with reference to FIG. 15.

Figure 15:
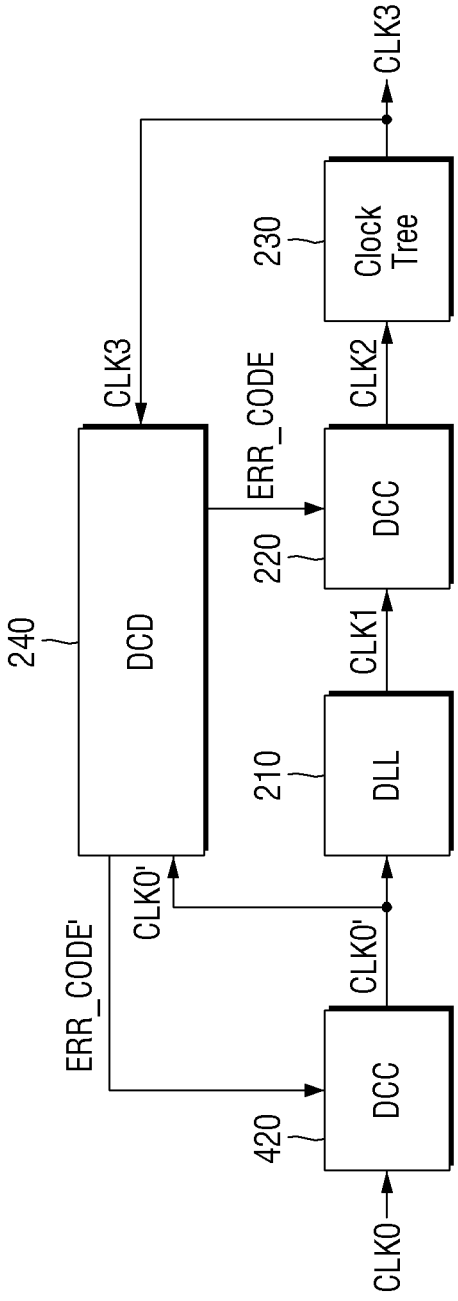
FIG. 15 is a block diagram of a clock correction circuit according to some embodiments.

FIG. 15 illustrates a clock correction circuit according to an embodiment. For convenience of explanation, embodiments and portions thereof explained using FIGS. 1 to 14 may be briefly described or omitted.

Referring to FIG. 15, the clock correction circuit 401 may include a delay-locked loop circuit 210, a duty cycle correction circuit 220, a clock tree 230, a duty cycle detection circuit 240, and a second duty cycle correction circuit 420.

The delay-locked loop circuit 210 may be placed between the second duty cycle correction circuit 420 and the duty cycle correction circuit 220. The delay-locked loop circuit 210 may connect the second duty cycle correction circuit 420 and the duty cycle correction circuit 220.

The duty cycle detection circuit 240 may receive the clock signal CLK0' from the second duty cycle correction circuit 420 and the third clock signal CLK3 from the clock tree 230. The duty cycle detection circuit 240 may provide the error code ERR_CODE to the second duty cycle correction circuit 420 in response to the clock signal CLK0'. The duty cycle detection circuit 240 may provide the error code ERR_CODE to the duty cycle correction circuit 220 in response to the third clock signal CLK3.

Here, an operation of providing the error code ERR_CODE' to the second duty cycle correction circuit 420, and an operation of providing the error code ERR_CODE to the duty cycle correction circuit 220 may be sequentially performed. However, embodiments of the present disclosure are not limited thereto, and the operation of providing the error code ERR_CODE' to the second duty cycle correction circuit 420, and the operation of providing the error code ERR_CODE to the duty cycle correction circuit 220 may be performed simultaneously.

In an embodiment, the error code ERR_CODE' may be substantially similar to the error code ERR_CODE, without limitation thereto. In an embodiment, the duty cycle detection circuit 240 and the second duty cycle detection circuit 440 of FIG. 12 may be implemented as a single duty cycle detection circuit 240 of FIG. 15.

In concluding this detailed description, those of ordinary skill in the pertinent art will appreciate that many variations and modifications may be made to the disclosed embodiments without substantially departing from the principles of the present disclosure. Therefore, the disclosed embodiments of the present disclosure are provided in a descriptive sense rather than for purposes of limitation.

What is claimed is:

1. A clock correction circuit comprising:
 a delay-locked loop circuit configured to receive a first clock signal and generate a second clock signal obtained by delaying the first clock signal;
 a first duty cycle correction circuit configured to receive the second clock signal and generate a first correction clock signal obtained by correcting a duty cycle of the second clock signal; and
 a duty cycle detection circuit which includes a second duty cycle correction circuit and an error code generation circuit,
 wherein the error code generation circuit receives the first correction clock signal, and generates a first error code as to whether to correct the duty cycle of the second clock signal on the basis of the first correction clock signal,
 wherein the second duty cycle correction circuit generates a second correction clock signal obtained by correcting the duty cycle of the first correction clock signal in response to the first error code,
 wherein the error code generation circuit generates a second error code as to whether to correct the duty cycle of the second clock signal on the basis of the second correction clock signal, and
 wherein the first duty cycle correction circuit receives the second error code, and generates a third correction clock signal obtained by correcting the duty cycle of the second clock signal in response to the second error code.

2. The clock correction circuit of claim 1, wherein:
 the first clock signal is an external signal,
 the second clock signal is an internal signal,
 a structure of the second duty cycle correction circuit is substantially the same as a structure of the first duty cycle correction circuit.

3. The clock correction circuit of claim 1, wherein:
 the error code generation circuit includes a duty cycle determination circuit and a counter,
 the duty cycle determination circuit receives the first correction clock signal, and generates a comparison signal on the basis of the first correction clock signal, and
 the counter generates a first error code as to whether to correct the duty cycle of the second clock signal on the basis of the comparison signal.

4. The clock correction circuit of claim 3, wherein:
 the error code generation circuit includes a determinator configured to receive the first error code, and
 the determinator provides the first error code to the second duty cycle correction circuit.

5. The clock correction circuit of claim 4, wherein the determinator provides the second error code to the first duty cycle correction circuit in response to an end signal.

6. The clock correction circuit of claim 1, further comprising:
 a clock tree circuit connected between the first duty cycle correction circuit and the duty cycle detection circuit,
 wherein the clock tree circuit receives the first correction clock signal from the first duty cycle correction circuit, and provides the first correction clock signal to the duty cycle detection circuit.

7. The clock correction circuit of claim 6, wherein the clock tree circuit receives the third correction clock signal from the first duty cycle correction circuit, and outputs the third correction clock signal.

8. A clock correction circuit comprising:
 a delay-locked loop circuit configured to receive a first clock signal, and generate a second clock signal obtained by delaying the first clock signal;
 a duty cycle correction circuit configured to receive the second clock signal, and generate a correction clock signal obtained by correcting a duty cycle of the second clock signal, the correction clock signal having a first frequency;
 a clock generator configured to receive the correction clock signal, and generate an update clock signal having a second frequency in response to the correction clock signal; and a duty cycle determination circuit configured to generate an error code, on the basis of the correction clock signal and the update clock signal, wherein the second frequency is different from the first frequency, wherein the duty cycle correction circuit receives the error code, and generates the correction clock signal obtained by correcting the duty cycle of the second clock signal in response to the error code during operation of the delay-locked loop circuit, wherein the clock generator generates a replica clock signal on the basis of the correction clock signal.

9. The clock correction circuit of claim 8, wherein:
the first clock signal is an external signal,
the second clock signal is an internal signal,
the second frequency is smaller than the first frequency.

10. The clock correction circuit of claim 8, wherein:
the clock generator includes a duty cycle correction loop delay replica circuit, and a delay measurement circuit, and
the duty cycle correction loop delay replica circuit generates replica clock signal on the basis of the correction clock signal.

11. The clock correction circuit of claim 10, wherein the delay measurement circuit generates the update clock signal on the basis of the replica clock signal and the correction clock signal.

12. The clock correction circuit of claim 8, wherein the error code is provided to the duty cycle correction circuit before end of the operation of the delay-locked loop circuit.

13. The clock correction circuit of claim 8, wherein the duty cycle of the correction clock signal is 50% after the end of the operation of the delay-locked loop circuit.

14. The clock correction circuit of claim 8, wherein the second clock signal has the first frequency.

15. A memory system comprising:
a memory controller; and
a memory device which is connected to the memory controller and receives a first clock signal from the memory controller,
wherein the memory device includes a clock correction circuit, a memory cell array, and a data I/O buffer,
wherein the clock correction circuit generates an output clock signal on the basis of the first clock signal,
wherein the memory cell array includes a plurality of memory cells,
wherein the data I/O buffer stores the data which is read from the memory cell array, and outputs the data in synchronization with the output clock signal,
wherein the clock correction circuit includes:
a delay-locked loop circuit configured to receive the first clock signal, and generate a second clock signal obtained by delaying the first clock signal;
a first duty cycle correction circuit configured to receive the second clock signal, and generate a first correction clock signal obtained by correcting a duty cycle of the second clock signal; and
a first duty cycle detection circuit configured to receive the first correction clock signal, generate a first error code as to whether to correct the duty cycle of the second clock signal on the basis of the first correction clock signal, and generate a second error code different from the first error code on the basis of the first error code and the first correction clock signal without the use of the first duty cycle correction circuit,
wherein the first duty cycle correction circuit receives the second error code, and generates the output clock signal obtained by correcting the duty cycle of the second clock signal in response to the second error code.

16. The memory system of claim 15, wherein the clock correction circuit further includes:
a second duty cycle correction circuit which is connected between the memory controller and the delay-locked loop circuit, be configured to receive the clock signal, and generate a second correction clock signal obtained by correcting the duty cycle of the clock signal; and
a second duty cycle detection circuit configured to receive the second correction clock signal, generate a third error code as to whether to correct the duty cycle of the clock signal on the basis of the second correction clock signal, and generate a fourth error code different from the third error code on the basis of the third error code and the second correction clock signal.

17. The memory system of claim 16, wherein the first duty cycle correction circuit and the first duty cycle detection circuit operate, after operations of the second duty cycle correction circuit and the second duty cycle detection circuit are ended.

18. The memory system of claim 16, wherein, while the operation of the delay-locked loop circuit is performed, operations of the first duty cycle correction circuit, the second duty cycle correction circuit, the first duty cycle detection circuit, and the second duty cycle detection circuit are performed.

19. The memory system of claim 16, wherein:
the first and second duty cycle detection circuits are implemented by a single circuit.

20. The memory system of claim 15, wherein:
the first clock signal is an external signal,
the second clock signal is an internal signal,
the clock correction circuit includes a clock tree circuit connected between the first duty cycle correction circuit and the data I/O buffer, and
the output clock signal is transferred to the data I/O buffer through the clock tree circuit.

\* \* \* \* \*